(12) United States Patent
Ichikawa

(10) Patent No.: US 8,987,782 B2
(45) Date of Patent: Mar. 24, 2015

(54) SEMICONDUCTOR STRUCTURE FOR FORMING A COMBINATION OF DIFFERENT TYPES OF DEVICES

(75) Inventor: Osamu Ichikawa, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/253,692

(22) Filed: Oct. 5, 2011

(65) Prior Publication Data

US 2012/0025268 A1 Feb. 2, 2012

Related U.S. Application Data

(63) Continuation-in-part of application No. PCT/JP2010/002449, filed on Apr. 2, 2010.

(30) Foreign Application Priority Data

Apr. 7, 2009 (JP) ................................ 2009-093442

(51) Int. Cl.
*H01L 29/267* (2006.01)
*H01L 27/06* (2006.01)
(Continued)

(52) U.S. Cl.
CPC ........ *H01L 27/0605* (2013.01); *H01L 21/8252* (2013.01); *H01L 29/7371* (2013.01); *H01L 29/7785* (2013.01); *H01L 29/7786* (2013.01)
USPC ................... 257/192; 257/183; 257/E29.081; 438/478

(58) Field of Classification Search
CPC .................................................. H01L 21/8252
USPC .......................... 257/195, 183, 192, 194, 197, 257/E27–E27.163, E21.009; 438/487
See application file for complete search history.

(56) References Cited

U.S. PATENT DOCUMENTS 5,141,569 A * 8/1992 Ito et al. .......................... 148/33
5,982,024 A 11/1999 Hata et al.
(Continued)

FOREIGN PATENT DOCUMENTS

EP 0600449 A2 6/1994
JP 62136081 6/1987
(Continued)

OTHER PUBLICATIONS

International Preliminary Report on Patentability for corresponding International Patent Application No. PCT/JP2010/002449 mailed Nov. 24, 2011.
(Continued)

*Primary Examiner* — William F Kraig
*Assistant Examiner* — Pavel Ivanov
(74) *Attorney, Agent, or Firm* — Sughrue Mion, PLLC

(57) ABSTRACT

There is provided a compound semiconductor wafer that is suitably used to form a plurality of different types of devices such as an HBT and an FET thereon. The semiconductor wafer includes a first semiconductor, a carrier-trapping layer that is formed on the first semiconductor and has an electron-trapping center or a hole-trapping center, a second semiconductor that is epitaxially grown on the carrier-trapping layer and serves as a channel in which a free electron or a free hole moves, and a third semiconductor including a stack represented by n-type semiconductor/p-type semiconductor/n-type semiconductor or represented by p-type semiconductor/n-type semiconductor/p-type semiconductor, where the stack is epitaxially grown on the second semiconductor.

12 Claims, 8 Drawing Sheets

(51) Int. Cl.
   *H01L 21/8252* (2006.01)
   *H01L 29/737* (2006.01)
   *H01L 29/778* (2006.01)

(56) References Cited

U.S. PATENT DOCUMENTS

| | | | |
|---|---|---|---|
| 6,008,509 A * | 12/1999 | Inai et al. | 257/192 |
| 7,656,002 B1 * | 2/2010 | Barratt et al. | 257/474 |
| 2003/0008440 A1 * | 1/2003 | Udagawa et al. | 438/167 |
| 2003/0025551 A1 * | 2/2003 | Kobayashi et al. | 327/540 |
| 2005/0285098 A1 * | 12/2005 | Fathimulla et al. | 257/20 |
| 2006/0118824 A1 * | 6/2006 | Otsuka et al. | 257/194 |
| 2006/0249752 A1 * | 11/2006 | Asano | 257/197 |
| 2006/0252651 A1 * | 11/2006 | Asano et al. | 505/193 |
| 2007/0090399 A1 * | 4/2007 | Chin et al. | 257/197 |
| 2007/0164316 A1 * | 7/2007 | Ohbu et al. | 257/197 |
| 2007/0215905 A1 * | 9/2007 | Kohiro et al. | 257/194 |
| 2007/0278523 A1 * | 12/2007 | Lin et al. | 257/194 |
| 2008/0230806 A1 * | 9/2008 | Pan et al. | 257/195 |
| 2010/0140672 A1 * | 6/2010 | Aoike et al. | 257/280 |
| 2012/0032699 A1 * | 2/2012 | Fukuhara et al. | 324/762.05 |

FOREIGN PATENT DOCUMENTS

| | | | |
|---|---|---|---|
| JP | 62291974 | | 12/1987 |
| JP | 02260433 | | 10/1990 |
| JP | 03-159135 | A | 7/1991 |
| JP | 04-85957 | A | 3/1992 |
| JP | 05-036729 | A | 2/1993 |
| JP | 06-169065 | A | 6/1994 |
| JP | H06-208963 | A | 7/1994 |
| JP | 08-022962 | A | 1/1996 |
| JP | 09-082898 | A | 3/1997 |
| JP | 09-293854 | A | 11/1997 |
| JP | 11-040576 | A | 2/1999 |
| JP | 11-106299 | A | 4/1999 |
| JP | 2001102312 | | 4/2001 |
| JP | 2001-244329 | A | 9/2001 |
| JP | 3439578 | B2 | 8/2003 |
| JP | 2007335586 | | 12/2007 |
| JP | 2008-060554 | A | 3/2008 |
| JP | WO 2010/119666 | * | 10/2010 |

OTHER PUBLICATIONS

Chinese Office Action issued on May 29, 2013 by the Chinese Patent Office in CN Application No. 201080014399.9.

Japanese Office Action issued in Japanese Patent Application No. 2010-086843 dated Jun. 24, 2014.

Taiwanese Office Action issued in TW Application No. 099110689 dated Nov. 26, 2014.

Notice of Reasons for Rejection issued Feb. 3, 2015 in Japanese Patent Application No. 2010-086843 with translation.

* cited by examiner

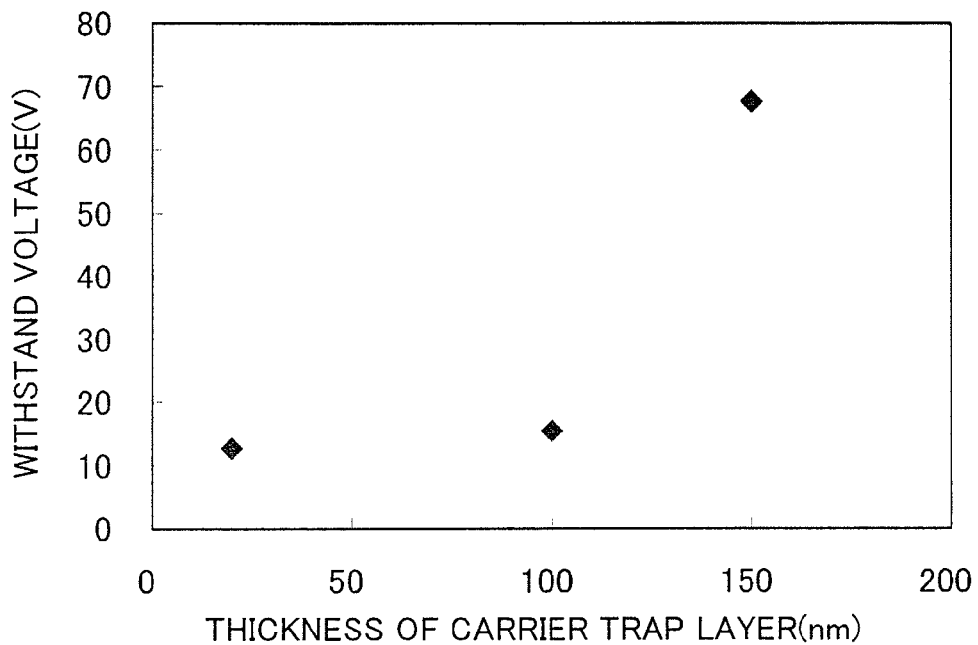
F I G. 6
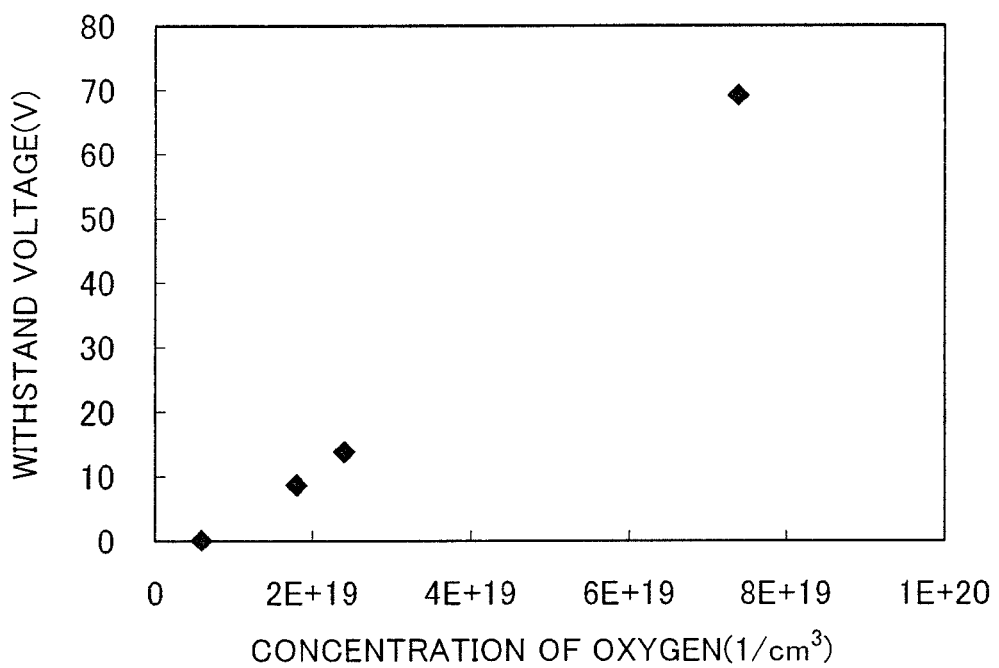
F I G. 7

US 8,987,782 B2

SEMICONDUCTOR STRUCTURE FOR FORMING A COMBINATION OF DIFFERENT TYPES OF DEVICES

CROSS REFERENCE TO RELATED APPLICATION

The contents of the following Japanese patent application and PCT patent application are incorporated herein by reference:

JP 2009-093442 filed on Apr. 7, 2009, and
PCT/JP2010/002449 filed on Apr. 2, 2010.

BACKGROUND

1. Technical Field

The present invention relates to a semiconductor wafer, a method of producing a semiconductor wafer, and an electronic device.

2. Related Art

JP 2008-060554 A discloses a method of producing an epitaxial Group 3-5 compound semiconductor wafer that is suitable for fabricating at least two different types of integrated active devices (for example, an HBT and an FET) thereon.

When a plurality of different types of devices, for example, a heterojunction bipolar transistor (HBT) and a field-effect transistor (FET), are formed on a single semiconductor wafer, the manufacturing process of one of the devices may affect the manufacturing process of the other device.

For example, the impurities (for example, Si) that are supplied as dopants during the HBT growth may remain in the reaction chamber used for producing the devices. In this case, the residual impurities may adhere onto the semiconductor wafer of the FET to be subsequently produced. The residual impurities generate carriers between the FET and the semiconductor wafer and cause leakage currents. The generated carriers may result in the insufficient device isolation. Furthermore, it may be difficult to optimize the characteristics of both of the devices formed on the single semiconductor wafer.

SUMMARY

For a solution to the above-mentioned problems, according to the first aspect related to the present invention, provided is one exemplary semiconductor wafer including a first semiconductor, a carrier-trapping layer that is formed on the first semiconductor and has an electron-trapping center or a hole-trapping center, a second semiconductor that is epitaxially grown on the carrier-trapping layer and serves as a channel in which a free electron or a free hole moves, and a third semiconductor including a stack represented by n-type semiconductor/p-type semiconductor/n-type semiconductor or represented by p-type semiconductor/n-type semiconductor/p-type semiconductor, where the stack epitaxially grown on the second semiconductor. For example, the first semiconductor contains a Group 3-5 compound semiconductor. The carrier-trapping layer is not less than 0.1 μm and not more than 1.5 μm in thickness in the growth direction between the first semiconductor and the second semiconductor. The semiconductor wafer may further include a depleted semiconductor that is disposed between the carrier-trapping layer and the second semiconductor and includes a depleted region. The depleted semiconductor is not less than 0.3 μm and not more than 1.5 μm in thickness in the growth direction between the carrier-trapping layer and the second semiconductor.

The depleted semiconductor may contain a plurality of Group 3-5 compound semiconductors, and, of the plurality of Group 3-5 compound semiconductors, two adjoining Group 3-5 compound semiconductors may together form at least one heterojunction selected from the group consisting of a heterojunction between $Al_xGa_{1-x}As$ ($0 \le x \le 1$) and $Al_yGa_{1-y}As$ ($0 \le y \le 1$, $x<y$), a heterojunction between $Al_pIn_qGa_{1-p-q}P$ ($0 \le p \le 1$, $0 \le q \le 1$) and $Al_rIn_sGa_{1-r-s}P$ ($0 \le r \le 1$, $0 \le s \le 1$, $p<r$), and a heterojunction between $Al_xGa_{1-x}As$ ($0 \le x \le 1$) and $Al_pIn_qGa_{1-p-q}P$ ($0 \le p \le 1$, $0 \le q \le 1$).

For example, the carrier-trapping layer contains a boron atom or an oxygen atom. The carrier-trapping layer may contain an oxygen atom and one of $Al_xGa_{1-x}As$ ($0 \le x \le 1$) and $Al_pIn_qGa_{1-p-q}P$ ($0 \le p \le 1$, $0 \le q \le 1$). When the carrier-trapping layer contains an oxygen atom, the concentration of the oxygen atom is, for example, not less than $1 \times 10^{18}$ cm$^{-3}$ and not more than $1 \times 10^{20}$ cm$^{-3}$.

At least one semiconductor of the second semiconductor and the third semiconductor contains carbon, for example. At least one semiconductor of the second semiconductor and the third semiconductor may contain silicon. The third semiconductor may contain silicon with which the third semiconductor is doped in a high concentration. The third semiconductor may include a ballast resistance layer having a resistance that suppresses a current flowing through the n-type semiconductor/p-type semiconductor/n-type semiconductor or the p-type semiconductor/n-type semiconductor/p-type semiconductor. The semiconductor wafer may further include a fourth semiconductor that is disposed between the second semiconductor and the third semiconductor and has a carrier of a conductivity type opposite to the conductivity type of the carrier in the second semiconductor.

According to the second aspect related to the present invention, provided is one exemplary method of producing a semiconductor wafer, including forming, on a first semiconductor, a carrier-trapping layer that has an electron-trapping center or a hole-trapping center, epitaxially growing, on the carrier-trapping layer, a second semiconductor that is to serve as a channel in which a free electron or a free hole moves, and epitaxially growing, on the second semiconductor, a third semiconductor including a stack represented by n-type semiconductor/p-type semiconductor/n-type semiconductor or a stack represented by p-type semiconductor/n-type semiconductor/p-type semiconductor.

The production method may include prior to the formation of the carrier-trapping layer, placing, within a reaction chamber, a wafer that has the first semiconductor at least on a surface thereof, after the wafer has been placed within the reaction chamber, introducing a gas containing arsine and hydrogen into the reaction chamber, and heating the first semiconductor within an atmosphere of the gas. For example, the gas contains arsine, hydrogen, and a p-type impurity gas containing an element or a compound containing a p-type impurity atom as a constituent.

The p-type impurity gas may include a halogenated hydrocarbon gas. The halogenated hydrocarbon gas is $CH_nX_{(4-n)}$, wherein each X denotes a halogen atom selected from the group consisting of Cl, Br and I, n denotes an integer satisfying the condition of $0 \le n \le 3$, and the atoms X may be either identical atoms or different atoms when $0 \le n \le 2$. The third semiconductor may include a semiconductor layer that serves as a base of a bipolar transistor, and the p-type impurity gas may be a gas of the same type as a gas containing a dopant to be introduced in the production of the semiconductor layer that serves as the base.

After the formation of the carrier-trapping layer, a depleted semiconductor including a depleted region may be formed with the concentration of an acceptor being controlled by regulating the molar supply ratio of a Group 5 source to a Group 3 source. The gas containing arsine and hydrogen includes, for example, an arsine source gas containing 1 ppb or less of $GeH_4$.

During epitaxial growth of a layer for supplying a carrier to the second semiconductor, silane or disilane may be introduced as a compound containing an n-type impurity atom that exhibits n-type conductivity, thereby epitaxially growing the layer for supplying the carrier, and during the formation of the third semiconductor, silane or disilane may be introduced as a compound containing an n-type impurity atom that exhibits n-type conductivity, thereby epitaxially growing the n-type semiconductor contained in the third semiconductor. The production method may further include epitaxially growing, on the second semiconductor, a fourth semiconductor that is to serve as a channel in which a carrier of a conductivity type opposite to the conductivity type of the carrier that moves in the second semiconductor moves.

The production method may further include, after the formation of the third semiconductor, removing the wafer on which the second semiconductor and the third semiconductor have been formed from the reaction chamber. Thereafter, the removal, the placement of the wafer, the introduction of the gas, the heating, the formation of the carrier-trapping layer, the epitaxial growth of the second semiconductor and the formation of the third semiconductor may be repeatedly performed.

According to the third aspect related to the present invention, provided is one exemplary electronic device including a first semiconductor, a carrier-trapping layer formed on the first semiconductor, a second semiconductor that is epitaxially grown on the carrier-trapping layer and serves as a channel in which a free electron or a free hole moves, a third semiconductor including a stack represented by n-type semiconductor/p-type semiconductor/n-type semiconductor or represented by p-type semiconductor/n-type semiconductor/p-type semiconductor, where the stack epitaxially grown on the second semiconductor, a field-effect transistor formed in the second semiconductor, and a heterojunction bipolar transistor formed in the third semiconductor.

As used herein, "B on A" refers to both of the case where "B is in contact with A" and the case where "there are one or more intervening elements between A and B."

BRIEF DESCRIPTION OF THE DRAWINGS

FIG. 6 illustrates the withstand voltage of a semiconductor wafer as a function of the thickness of a carrier-trapping layer 232.

FIG. 7 illustrates the withstand voltage of a semiconductor wafer as a function of the oxygen concentration of the carrier-trapping layer 232.

DESCRIPTION OF EXEMPLARY EMBODIMENTS

Figure 1:
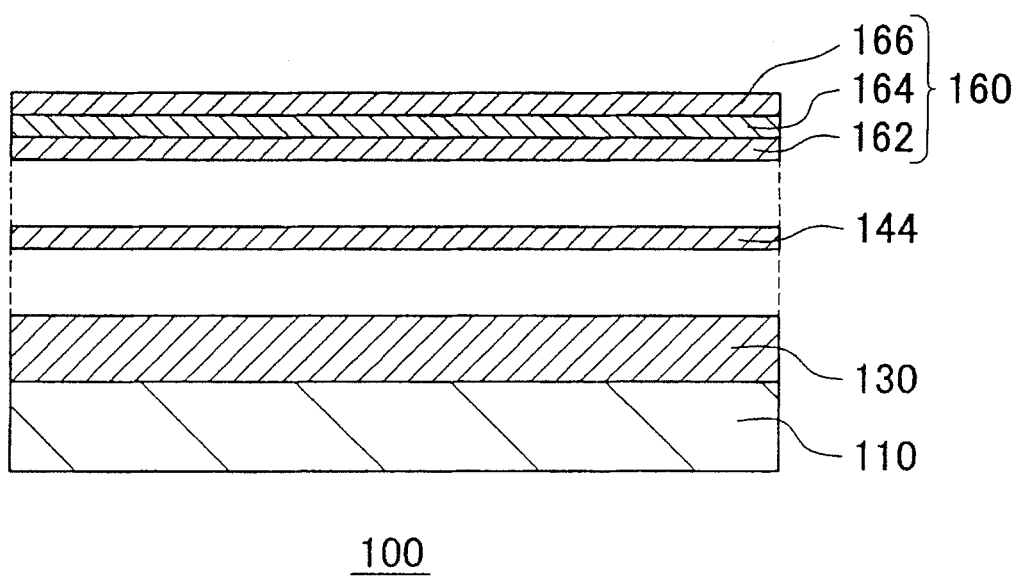
FIG. 1 illustrates an exemplary cross-section of a semiconductor wafer 100.

FIG. 1 illustrates an exemplary cross-section of a semiconductor wafer 100. The semiconductor wafer 100 includes a first semiconductor 110, a carrier-trapping layer 130, a second semiconductor 144, and a third semiconductor layer 160. The third semiconductor 160 has a collector layer 162, a base layer 164, and an emitter layer 166. In FIG. 1, the regions defined by the dashed lines may include other semiconductors and the like as needed. For example, the regions defined by the dashed lines may include a carrier-supplying semiconductor that supplies the second semiconductor 144 or the third semiconductor 160 with carriers, a spacer layer, a buffer layer or the like.

The first semiconductor 110 is a wafer having a sufficient mechanical strength to support the other constituents of the semiconductor wafer 100. The first semiconductor 110 is, for example, a Group 3-5 compound semiconductor. The first semiconductor 110 is, for example, GaAs, InGaAs, AlGaAs, GaN, or AlGaN.

The first semiconductor 110 may be a high-resistivity GaAs single-crystal wafer. The GaAs single-crystal wafer is, for example, produced by the Liquid Encapsulated Czochralski (LEC) method, the Vertical Bridgman (VB) method, the Vertical Gradient Freeze (VGF) method or the like. The first semiconductor 110 may be a wafer itself, or a semiconductor layer that is epitaxially grown on a wafer. The first semiconductor 110 may include a buffer layer.

The carrier-trapping layer 130 includes an electron-trapping center or a hole-trapping center. In other words, a deep-level trap is formed in the carrier-trapping layer 130. Having a deep-level trap, the carrier-trapping layer 130 captures carriers that pass through the carrier-trapping layer 130. Accordingly, the carrier-trapping layer 130 can reduce the leakage currents between the first semiconductor 110 and the second semiconductor 144, which are disposed below and above the carrier-trapping layer 130. Here, if impurities adhere to the first semiconductor 110 and spread, carriers may be generated and directed toward the second semiconductor 144. The carrier-trapping layer 130 can prevent such carriers from causing leakage currents. The electron-trapping center or the hole-trapping center is an impurity atom or a lattice defect.

The p-type impurities used in the second semiconductor 144, the third semiconductor 160, or the carrier-supplying semiconductor for supplying the second and third semiconductors 144 and 160 with carriers are, for example, C. The n-type impurities used in the second semiconductor 144, the third semiconductor 160, or the carrier-supplying semiconductor for supplying the second and third semiconductors 144 and 160 with carriers are, for example, Si. For example, when Si is used as the n-type impurities for the third semiconductor 160, Si may remain in the reaction chamber after the semiconductor wafer 100 has been produced. The residual Si may adhere to and spread over the surface of the first semiconductor 110 of a semiconductor wafer 100 to be subsequently produced. The residual Si may cause carriers to move between the first semiconductor 110 and the second semiconductor 144. When the carrier-trapping layer 130 contains an element that provides a deep-level trap, such as oxygen atoms, the oxygen atoms capture the carriers. Thus, the leakage currents can be prevented.

The carrier-trapping layer 130 is formed on the first semiconductor 110, for example, by an epitaxial growth method. The epitaxial growth method is, for example, metalorganic chemical vapor deposition (MOCVD), and molecular beam Epitaxy (MBE).

For example, the carrier-trapping layer 130 is in contact with the first semiconductor 110. As long as the carrier-trapping layer 130 is positioned between the first semiconductor 110 and the second semiconductor 144, there may be other intervening layers between the carrier-trapping layer 130 and the first semiconductor 110. For example, the semiconductor wafer 100 may have, between the carrier-trapping layer 130 and the first semiconductor 110, a buffer layer that is lattice-matched or pseudo-lattice-matched with the first semiconductor 110 and the carrier-trapping layer 130.

The semiconductor wafer 100 may include a depleted semiconductor between the carrier-trapping layer 130 and the second semiconductor 144.

The second semiconductor 144 is epitaxially grown on the carrier-trapping layer 130. When an electronic element is formed in the semiconductor wafer 100, the second semiconductor 144 serves as a channel in which one type of carriers, namely, electrons or holes, move. The epitaxial growth method includes, for example, MOCVD, and MBE.

The semiconductor wafer 100 may have other semiconductors between the second semiconductor 144 and the carrier-trapping layer 130. For example, the semiconductor wafer 100 may further have a carrier-supplying semiconductor, a spacer layer, or the like between the second semiconductor 144 and the carrier-trapping layer 130. The second semiconductor 144 is, for example, a Group 3-5 compound semiconductor such as GaAs, InGaAs, or InGaP.

The third semiconductor 160 includes the collector layer 162, the base layer 164, and the emitter layer 166. Each of the layers constituting the third semiconductor 160 is formed, for example, by an epitaxial growth method. The epitaxial growth method includes, for example, MOCVD, and MBE. The semiconductor wafer 100 may include other semiconductors between the third semiconductor 160 and the second semiconductor 144. For example, the semiconductor wafer 100 includes a carrier-supplying semiconductor, a spacer layer, or the like between the second semiconductor 144 and the third semiconductor 160.

The collector layer 162, the base layer 164, and the emitter layer 166 in the third semiconductor 160 constitute a stack represented by n-type semiconductor/p-type semiconductor/n-type semiconductor, or a stack represented by p-type semiconductor/n-type semiconductor/p-type semiconductor. The collector layer 162, the base layer 164, and the emitter layer 166 respectively serve as a collector, a base, and an emitter of a bipolar transistor. The emitter layer 166 may contain a high concentration of silicon as dopants. The concentration of the silicon is, for example, not less than $1\times10^{18}$ cm$^{-3}$ and not more than $1\times10^{20}$ cm$^{-3}$.

Figure 2:
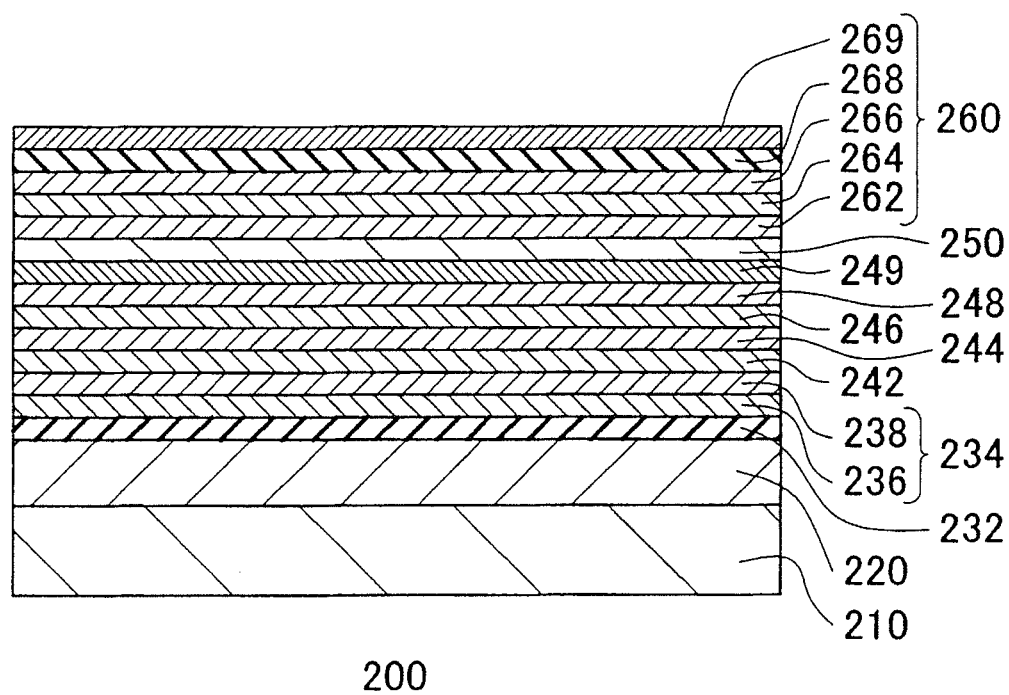
FIG. 2 illustrates an exemplary cross-section of a semiconductor wafer 200.

FIG. 2 illustrates an exemplary cross-section of a semiconductor wafer 200. The semiconductor wafer 200 includes a first semiconductor 210, a buffer layer 220, a carrier-trapping layer 232, a depleted semiconductor 234, a carrier-supplying semiconductor 242, a second semiconductor 244, a carrier-supplying semiconductor 246, a barrier-forming semiconductor 248, a contact layer 249, a buffer layer 250, and a third semiconductor 260. The semiconductor wafer 200 is an exemplary semiconductor wafer suitable for producing an FET, in particular, high electron mobility transistor (HEMT), and an HBT. The carrier-supplying semiconductor 242, the second semiconductor 244, the carrier-supplying semiconductor 246, the barrier-forming semiconductor 248, and the contact layer 249 are used, for example, for forming a HEMT. The third semiconductor 260 is used, for example, for forming an HBT.

The first semiconductor 210 is equivalent to the first semiconductor 110 of the semiconductor wafer 100. The carrier-trapping layer 232 is equivalent to the carrier-trapping layer 130. The second semiconductor 244 is equivalent to the second semiconductor 144. The third semiconductor 260 is equivalent to the third semiconductor 160. These equivalent constituents may not be repeatedly described.

The buffer layer 220 is, for example, a semiconductor layer that serves as a buffer layer to achieve a match, in terms of lattice constant, between a semiconductor layer to be formed thereon and the first semiconductor 210. The buffer layer 220 may be a semiconductor layer that is provided in order to assure high crystallinity for a semiconductor to be formed thereon. The buffer layer 220 may be a semiconductor layer that can prevent degradation in characteristics of the semiconductor wafer 200 that results from impurity atoms left on the surface of the first semiconductor 210. The buffer layer 220 may be a semiconductor layer that suppresses the leakage currents from a semiconductor layer to be formed thereon. The buffer layer 220 is, for example, epitaxially grown. The buffer layer 220 is, for example, made of GaAs or AlGaAs.

The carrier-trapping layer 232 and the depleted semiconductor 234 are, for example, epitaxially grown. The carrier-trapping layer 232 contains, as electron-trapping centers or hole-trapping centers, oxygen atoms or boron atoms, for example. The carrier-trapping layer 232 may contain oxygen atoms and one of $Al_xGa_{1-x}As$ (0≤x≤1) and $Al_pIn_qGa_{1-p-q}P$ (0≤p≤1, 0≤q≤1).

Containing oxygen atoms therein, the carrier-trapping layer 232 has a deep-level trap formed therein. Accordingly, the carrier-trapping layer 232 captures carriers that pass therethrough, thereby preventing leakage currents from occurring between the second semiconductor 244 and the first semiconductor 210, which are positioned above and below the carrier-trapping layer 232.

The resistivity of the carrier-trapping layer 232 in the thickness direction varies depending on the composition, the oxygen dopant concentration, and the thickness. For example, when the carrier-trapping layer 232 is $Al_xGa_{1-x}As$ (0≤x≤1), the Al proportion is desirably as high as possible without imparing the crystal quality, and x is preferably about 0.3 to 0.5 for practical use. The oxygen dopant concentration is desirably as high as possible without impairing the crystal quality and the concentration of the oxygen atoms is preferably not less than $1\times10^{18}$ cm$^{-3}$ and not more than $1\times10^{20}$ cm$^{-3}$. The concentration of the oxygen atoms can be measured, for example, using secondary ion mass spectrometry. The thickness of the carrier-trapping layer 232 is desirably as large as possible without adversely affecting the growth time, and is preferably not less than 0.1 μm and not more than 1.5 μm.

The depleted semiconductor 234 is formed, for example, between the carrier-trapping layer 232 and the second semiconductor 244. The depleted semiconductor 234 includes a depleted region. The depleted region prevents passage of carriers, so that leakage currents can be prevented from occurring between the second semiconductor 244 and the first semiconductor 210, which are positioned above and below the carrier-trapping layer 232. The depleted semiconductor 234 is preferably not less than 0.3 μm and not more than 1.5 μm in thickness in the growth direction between the carrier-trapping layer 232 and the second semiconductor 244. When the depleted semiconductor 234 has a thickness in the above range, the depleted semiconductor 234 can be formed with a small amount of source and can assure a sufficient withstand voltage. Here, the withstand voltage is defined as a voltage that yields a current density of 5 mA/cm$^2$ between the first semiconductor 210 and the second semiconductor 244.

The following describes the effects of the depleted semiconductor 234. For example, when the second semiconductor 244 is i-GaAs, the carrier-supplying semiconductors 242 and 246 are n-type AlGaAs, and the depleted semiconductors 236 and 238 are respectively p-type $Al_yGa_{1-y}As$ ($0 \leq y \leq 1$) and p-type $Al_xGa_{1-x}As$ ($0 \leq x \leq 1$) and x<y, a PN junction is formed between the depleted semiconductor 238 and the n-type carrier-supplying semiconductor 242 and a depleted region is formed in the vicinity of the PN junction. The depleted region suppresses passage of electrons from the carrier-supplying semiconductor 242 and thus prevents leakage currents.

When x<y, the depleted semiconductor 236 has a higher Al proportion than the depleted semiconductor 238. Thus, the depleted semiconductor 236 has a wider bandgap than the depleted semiconductor 238. This difference in bandgap results in an energy barrier, which in turn prevents carriers from moving from the depleted semiconductor 238 to the depleted semiconductor 236 and thus suppresses the occurrence of leakage currents.

In the example of FIG. 2, a single heterojunction is formed in the depleted semiconductor 234 by the depleted semiconductors 236 and 238. The depleted semiconductor 234 may include more p-type semiconductor layers. Furthermore, each of the layers constituting the depleted semiconductor 234 may have a thickness on the order of atoms, so that the depleted semiconductor 234 as a whole may form a superlattice. In this case, a large number of heterojunctions form a large number of energy barriers, as a result of which leakage currents can be more effectively prevented.

The depleted semiconductor 234 may contain a plurality of Group 3-5 compound semiconductors. Of such Group 3-5 compound semiconductors, two adjoining Group 3-5 compound semiconductors may together form at least one heterojunction selected from the group consisting of a heterojunction between $Al_xGa_{1-x}As$ ($0 \leq x \leq 1$) and $Al_yGa_{1-y}As$ ($0 \leq y \leq 1$, x<y), a heterojunction between $Al_pIn_qGa_{1-p-q}P$ ($0 \leq p \leq 1$, $0 \leq q \leq 1$) and $Al_rIn_sGa_{1-r-s}P$ ($0 \leq r \leq 1$, $0 \leq s \leq 1$, p<r), and a heterojunction between $Al_xGa_{1-x}As$ ($0 \leq x \leq 1$) and $Al_pIn_qGa_{1-p-q}P$ ($0 \leq p \leq 1$, $0 \leq q \leq 1$).

The carrier-supplying semiconductors 242 and 246 are designed to supply the second semiconductor 244 with carriers. By positioning the carrier-supplying semiconductors 242 and 246 on the respective sides of the second semiconductor 244 to form two heterojunctions, the second semiconductor 244 can receive a higher concentration of carriers. The carrier-supplying semiconductors 242 and 246 are formed, for example, by an epitaxial growth method. The epitaxial growth method includes, for example, MOCVD, and MBE. The carrier-supplying semiconductors 242 and 246 are, for example, made of GaAs, AlGaAs or InGaP.

The barrier-forming semiconductor 248 forms a Schottky contact with a metal electrode formed therein. The barrier-forming semiconductor 248 is formed, for example, by an epitaxial growth method. The epitaxial growth method includes, for example, MOCVD, and MBE. The barrier-forming semiconductor 248 is, for example, made of AlGaAs.

The contact layer 249 forms an ohmic contact with a metal electrode formed therein. The contact layer 249 is formed, for example, by an epitaxial growth method. The contact layer 249 is, for example, made of GaAs.

The buffer layer 250 separates a third semiconductor formed thereabove from a semiconductor formed therebelow to prevent the third semiconductor and the semiconductor from affecting each other. The buffer layer 250 is formed, for example, by an epitaxial growth method. The buffer layer 250 is, for example, made of GaAs or InGaP.

A collector layer 262 is equivalent to the collector layer 162 of the semiconductor wafer 100. A base layer 264 is equivalent to the base layer 164. An emitter layer 266 is equivalent to the emitter layer 166. The collector layer 262, the base layer 264, and the emitter layer 266 are respectively semiconductor layers that serve as a collector, a base and an emitter of a bipolar transistor. The explanation of the collector layer 262, the base layer 264 and the emitter layer 266 is omitted in the following.

A ballast resistance layer 268 is a high resistivity layer provided in the vicinity of the emitter for the purpose of suppressing excessive currents from flowing into the bipolar transistor. If the semiconductor wafer 200 has the ballast resistance layer 268, the emitter resistance of the transistor formed in the semiconductor wafer 200 is sufficiently high to prevent excessive emitter currents. Consequently, thermal runaway is prevented from occurring in the transistor formed in the semiconductor wafer 200.

A contact layer 269 forms an ohmic contact with a metal electrode formed therein. The contact layer 269 is formed, for example, by an epitaxial growth method. The contact layer 269 is, for example, made of InGaAs.

Figure 3:
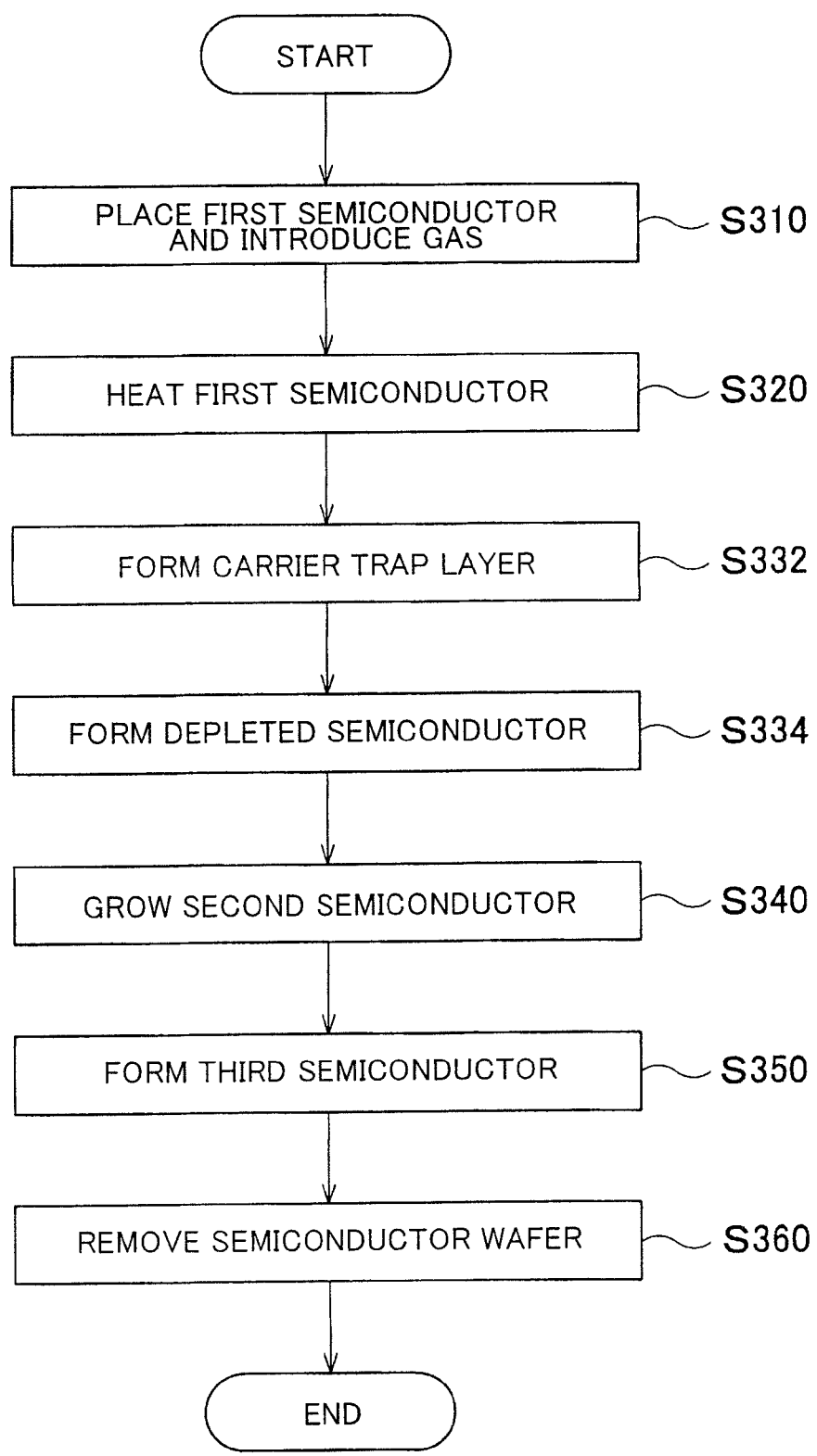
FIG. 3 is a flow chart illustrating an exemplary method of producing a semiconductor wafer.

FIG. 3 is a flow chart illustrating an exemplary method of producing a semiconductor wafer. The following describes a method of producing, for example, the semiconductor wafer 200 using MOCVD. The method of producing a semiconductor wafer relating to the present embodiment includes a step S310 of introducing a gas after the first semiconductor 210 is placed, a step S320 of heating the first semiconductor 210, a step S332 of forming the carrier-trapping layer 232, a step S334 of forming the depleted semiconductor, a step S340 of growing the second semiconductor 244, a step S350 of forming the third semiconductor 260, and a step S360 of removing the semiconductor wafer 200.

Figure 4:
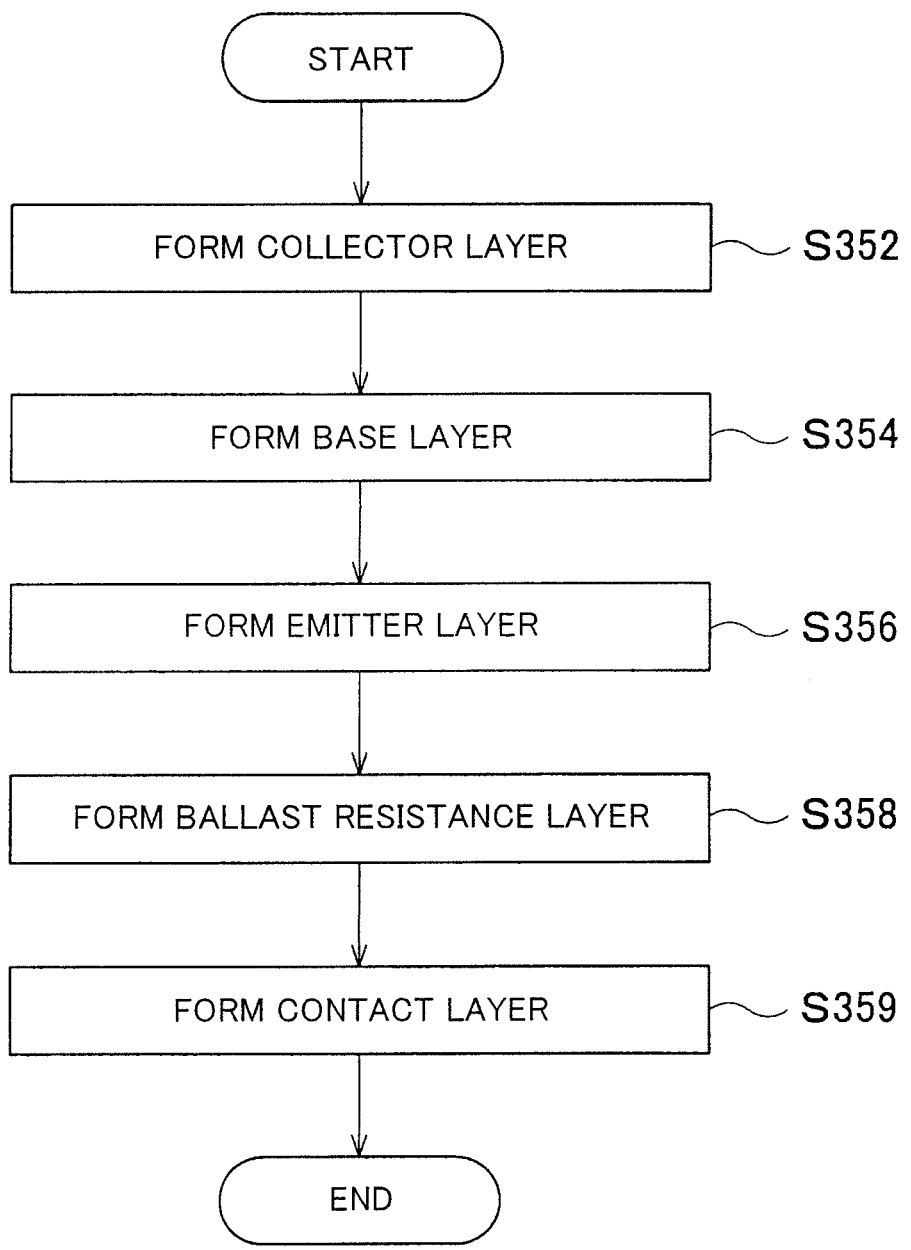
FIG. 4 is a flow chart illustrating an exemplary step of forming a third semiconductor.

As shown in FIG. 4, the step S350 of forming the third semiconductor includes a step S352 of forming the collector layer, a step S354 of forming the base layer, a step S356 of forming the emitter layer, a step S358 of forming the ballast resistance layer, and a step S359 of forming the contact layer.

When a plurality of semiconductor wafers 200 are successively produced in the single reaction chamber using the production method shown in FIG. 3, a previous semiconductor wafer 200 producing process may leave a large amount of impurity atoms in the reaction chamber. For example, the semiconductor wafer 200 is obtained by sequentially epitaxially growing, on the first semiconductor 210, the buffer layer 220, the carrier-trapping layer 232, the depleted semiconductor 234, the carrier-supplying semiconductor 242, the second semiconductor 244, the carrier-supplying semiconductor 246, the barrier-forming semiconductor 248, the contact layer 249, the buffer layer 250, and the third semiconductor 260. When the third semiconductor 260 is an NPN junction structure, a large amount of donor impurity atoms are added to the n-type emitter layer 266 or the contact layer 269. Accordingly, after the emitter layer 266 or the contact layer 269 is formed, a large amount of donor impurity atoms (first impurity atoms) remain in the reaction chamber.

For example, when the donor impurity atoms are Si atoms, a large amount of Si atoms remain in the reaction chamber. The residual Si atoms may adversely affect the subsequent semiconductor wafer producing process. For example, when the first semiconductor 210 is placed within the reaction chamber to perform the subsequent process, the residual Si atoms in the reaction chamber may adhere to the surface of the first semiconductor 210.

The adhered Si atoms serve as donors when dispersed into the first semiconductor 210 and one or more semiconductor layers formed on the first semiconductor 210. As a result of this, insulation failures may occur in the semiconductor wafer 200 and degrade the device characteristics of the HEMT to be formed by using the second semiconductor 244 and the like. Furthermore, when a plurality of devices are formed in the semiconductor wafer 200, insulation failures occur between adjoining devices due to the donors and thus degrade device separation. The production method of the present embodiment can prevent adverse effects of the first impurity atoms, for example, Si atoms, left in the reaction chamber, through the following process.

In the step S310 of placing the first semiconductor and introducing a gas, the gas is introduced into the reaction chamber, in which the first semiconductor 210 has been placed. For example, a GaAs wafer is placed within the reaction chamber as the first semiconductor. The gas contains, for example, arsine ($AsH_3$), hydrogen, and a gas containing impurity atoms that exhibit p-type conductivity (hereinafter referred to as a p-type doping gas). The p-type doping gas may include a halogenated hydrocarbon gas. The halogenated hydrocarbon gas is, for example, $CH_nX_{(4-n)}$, where each X denotes a halogen atom selected from the group consisting of Cl, Br and I, n denotes an integer satisfying the condition of $0 \le n \le 3$, and the atoms X may be either identical atoms or different atoms when $0 \le n \le 2$. The p-type doping gas is, for example, $CCl_3Br$.

The p-type doping gas may be a gas of the same type as the gas used to form the base layer 264. The p-type doping gas may contain the same dopants as the gas used to form the base layer 264. The p-type doping gas may be the same gas as the gas used to form the base layer 264. The use of the same gas as the gas used to form the base layer 264 can eliminate the dedicated supply line for supplying the heating p-type doping gas. The gas introduced in the step S310 may contain an arsine source gas containing 1 ppb or less of $GeH_4$.

After the first semiconductor 210 is placed and before the gas is introduced, the reaction chamber may be evacuated to vacuum. After the first semiconductor 210 is placed, the reaction chamber may be purged using a nitrogen gas, a hydrogen gas, an inert gas or the like. The above-mentioned gases may be introduced prior to the subsequent heating step S320. These gases may be introduced in the middle of each heating step, or switched. Only one of the gases may be independently introduced, or more than one of the gases may be simultaneously introduced depending on the heating step. The p-type doping gas may be independently introduced, or the p-type doping gas and hydrogen may be simultaneously introduced.

In the step S320 of heating the first semiconductor, the first semiconductor 210 is heated in the atmosphere of the introduced gas. The heating is carried out, for example, at a temperature from 400° C. to 800° C. The pressure within the reaction chamber is, for example, from 5 Torr to the atmospheric pressure. The heating lasts, for example, for from 5 seconds to 50 minutes. The values of the above-described parameters may be varied depending on the apparatus used to produce the semiconductor wafer 200, the volume of the reaction chamber, the amount of the residual impurity atoms within the reaction chamber or other factors. The heating conditions may be set in such a manner that the effective carrier density indicated by the difference between the electron density and the hole density is lowered at least on the surface of the first semiconductor 210.

For example, when Si atoms remain in the reaction chamber as the impurity atoms that exhibit n-type conductivity, in the above-described step S310 of introducing the gas, arsine, hydrogen, and $CCl_3Br$ are introduced and the first semiconductor 210 is heated at a temperature from 500° C. to 800° C., with the pressure within the reaction chamber being set to 5 Torr to the atmospheric pressure, and for a period of time from 10 seconds to 15 minutes. Through this heating step, C contained in $CCl_3Br$ compensates for the donor effects of the Si atoms present on the surface of the first semiconductor 210. This resultantly suppresses the influences of the impurity atoms such as the Si atoms present on the surface of the first semiconductor 210. As a result, insulation failures can be prevented from occurring between the first semiconductor 210 and a semiconductor to be epitaxially grown thereon.

In the step S332 of forming the carrier-trapping layer, the buffer layer 220 is formed on the heated first semiconductor 210, and the carrier-trapping layer 232 is formed on the buffer layer 220. As the buffer layer 220, for example, a p-type GaAs layer may be epitaxially grown.

As the carrier-trapping layer 232, for example, $Al_pIn_qGa_{1-p-q}P$ ($0 \le p \le 1$, $0 \le q \le 1$) or $Al_xGa_{1-x}As$ ($0 \le x \le 1$) containing oxygen atoms may be epitaxially grown. The concentration of the oxygen atoms may be not less than $1 \times 10^{18}$ cm$^{-3}$ and not more than $1 \times 10^{20}$ cm$^{-3}$.

The added oxygen atoms form a deep-level trap in the semiconductor. This deep-level trap captures the carriers passing through the carrier-trapping layer 232. Accordingly, leakage currents can be prevented from flowing between the second semiconductor 244 and the first semiconductor 210, which are respectively positioned above and below the carrier-trapping layer 232.

In the step S334 of forming the depleted semiconductor, the depleted semiconductors 236 and 238 constituting the depleted semiconductor 234 are sequentially epitaxially grown. The depleted semiconductors 236 and 238 are, for example, Group 3-5 compound semiconductors. The depleted semiconductors 236 and 238 may together form at least one heterojunction selected from the group consisting of a heterojunction between $Al_xGa_{1-x}As$ ($0 \le x \le 1$) and $Al_yGa_{1-y}As$ ($0 \le y \le 1$, $x<y$), a heterojunction between $Al_pIn_qGa_{1-p-q}P$ ($0 \le p \le 1$, $0 \le q \le 1$) and $Al_rIn_sGa_{1-r-s}P$ ($0 \le r \le 1$, $0 \le s \le 1$, $p<r$), and a heterojunction between $Al_xGa_{1-x}As$ ($0 \le x \le 1$) and $Al_pIn_qGa_{1-p-q}P$ ($0 \le p \le 1$, $0 \le q \le 1$). This heterojunction forms an energy barrier and thus prevents leakage currents from flowing from the semiconductor to be formed above the depleted semiconductor 234 to the first semiconductor 210.

The epitaxial growth using MOCVD can employ, as the Group 3 element source, trihydride or trialkyl compounds made up by metal atoms each of which is combined with hydrogen or an alkyl group with a carbon number of 1-3. For example, trimethylgallium (TMG), trimethylindium (TMI), and trimethylaluminum (TMA) can be used. As the Group 5 element source gas, arsine ($AsH_3$), alkyl arsine obtained by substituting at least one hydrogen atom of arsine with an alkyl group with a carbon number of 1-4, or phosphine ($PH_3$) can be used. As the compound that yields n-type semiconductors, silane or disilane can be used. The concentration of the acceptors in the depleted semiconductor 234 can be controlled by regulating the molar supply ratio of the Group 5 element source to the Group 3 element source.

During the epitaxial growth of the Group 3-5 semiconductor using MOCVD, chemical reaction generates methane from the organic metal. The methane is partially decomposed into carbon. Carbon is a Group 4 element and can replace either the Group 3 element or the Group 5 element in the Group 3-5 semiconductor.

When replacing the Group 3 element, carbon serves as a donor. Thus, an n-type epitaxial layer is obtained. When replacing the Group 5 element, carbon serves as an acceptor. Thus, a p-type epitaxial layer is obtained. In other words, the resulting epitaxial layer can be of p-type or n-type depending on how carbon acts. The acceptor concentration or the donor concentration of the Group 3-5 semiconductor varies depending on the amount of added carbon.

Similar results are obtained when other Group 4 elements such as Si or Ge are added to the Group 3-5 semiconductor epitaxial layer. Thus, the acceptor concentration of the grown epitaxial layer can be controlled by regulating the partial pressures of the source gases or by adding Group 4 impurity atoms.

The concentration of the acceptors in the depleted semiconductor 234 can be controlled through regulation of the partial pressures, which is achieved by adjusting the molar supply ratio of the Group 5 element source to the Group 3 element source. The gas used in the present embodiment includes an arsine source gas containing 1 ppb or less of $GeH_4$. In other words, the gas containing arsine, which is supplied as the Group 5 source, contains substantially no Group 4 impurity atoms. Therefore, the concentration of the acceptor can be accurately controlled by regulating the molar supply ratio between the source gases. Specifically speaking, the acceptor concentration can be increased by decreasing the molar supply ratio of the Group 5 element source to the Group 3 element source, and decreased by increasing the molar supply ratio.

When the acceptor concentration or the donor concentration is not less than $3 \times 10^{18}$ cm$^{-3}$, it is preferable to use the Hall measurement to measure the acceptor concentration or the donor concentration in terms of measurement accuracy. When the acceptor concentration or the donor concentration is less than $3 \times 10^{18}$ cm$^{-3}$, it is preferable to use the capacitive voltage (CV) method to measure the acceptor concentration or the donor concentration in terms of measurement accuracy.

The epitaxial growth conditions include, for example, the pressure within the reaction chamber being set at 0.1 atm, the growth temperature being set at 650° C., and the growth rate being set at 1 to 3 µm/hr. As the carrier gas for the sources, highly pure hydrogen can be used, for example. The carrier-supplying semiconductor 242, the second semiconductor 244, the carrier-supplying semiconductor 246, the barrier-forming semiconductor 248, the contact layer 249, the buffer layer 250, and the third semiconductor 260 described below can be also epitaxially grown with the parameters such as the source gases, the pressure within the chamber, the growth temperature, and the growth time being appropriately adjusted.

In the step S340 of growing the second semiconductor, the second semiconductor 244, the carrier-supplying semiconductor 242, the carrier-supplying semiconductor 246, the barrier-forming semiconductor 248, the contact layer 249, and the buffer layer 250 are epitaxially grown on the depleted semiconductor 234. These semiconductors may include n-type semiconductors, and the compound used for forming such n-type semiconductors includes, for example, silane or disilane.

The respective semiconductors are formed using the above-described sources with the parameters such as the source gases, the pressure within the chamber, the growth temperature, and the growth time being appropriately adjusted. For example, when the first semiconductor 210 is a GaAs wafer, the carrier-supplying semiconductors 242 and 246 of n-type AlGaAs, the second semiconductor 244 of i-type InGaAs, the barrier-forming semiconductor 248 of AlGaAs, the contact layer 249 of GaAs, and the buffer layer 250 of GaAs may be formed.

In the step S350 of growing the third semiconductor, the third semiconductor 260 is formed on the buffer layer 250. The compound used for forming the n-type semiconductor included in the third semiconductor 260 is, for example, silane or disilane. As shown in FIG. 4, the step S350 of forming the third semiconductor includes the step S352 of forming the collector layer, the step S354 of forming the base layer, the step S356 of forming the emitter layer, the step S358 of forming the ballast resistance layer, and the step S359 of forming the contact layer.

In the step S352 of forming the collector layer, the collector layer 262 included in the third semiconductor 260 is epitaxially grown on the buffer layer 250. The collector layer 262 is a semiconductor layer that serves as a collector of a bipolar transistor. The collector layer 262 is doped with acceptor impurity atoms or donor impurity atoms depending on whether the finally-obtained bipolar transistor is of NPN or PNP type. The acceptor impurity atoms are, for example, carbon atoms and the donor impurity atoms are, for example, Si atoms or Ge atoms.

In the step S354 of forming the base layer, the base layer 264 included in the third semiconductor 260 is epitaxially grown on the collector layer 262. The base layer 264 is a semiconductor layer that serves as a base of a bipolar transistor. The base layer 264 is doped with acceptor impurity atoms or donor impurity atoms depending on whether the finally-obtained bipolar transistor is of NPN or PNP type. The acceptor impurity atoms are, for example, carbon atoms and the donor impurity atoms are, for example, Si atoms or Ge atoms.

In the step S356 of forming the emitter layer, the emitter layer 266 included in the third semiconductor 260 is epitaxially grown on the base layer 264. The emitter layer 266 is a semiconductor layer that serves as an emitter of a bipolar transistor. The emitter layer 266 is doped with acceptor impurity atoms or donor impurity atoms depending on whether the finally-obtained bipolar transistor is of NPN or PNP type. The acceptor impurity atoms are, for example, carbon atoms and the donor impurity atoms are, for example, Si atoms or Ge atoms.

In the step S358 of forming the ballast resistance layer, the ballast resistance layer 268 is formed on the emitter layer 266. The ballast resistance layer 268 is a resistance layer that serves as an emitter ballast of a bipolar transistor. In the step S359 of forming the contact layer, the contact layer 269 is formed on the ballast resistance layer 268. The contact layer 269 may contain a high concentration of silicon as dopants. The concentration of silicon is, for example, not less than $1 \times 10^{18}$ cm$^{-3}$ and not more than $1 \times 10^{20}$ cm$^{-3}$.

In the step S360 of removing the semiconductor wafer 200, the semiconductor wafer 200 that has been produced by the above-described steps is removed from the reaction chamber. Since the semiconductor wafer 200 has the carrier-trapping layer 232, a subsequent first semiconductor 210 to be processed can be immediately placed within the reaction chamber, without the step intended to reduce the affects of the impurity atoms left within the reaction chamber, to repeatedly perform the semiconductor wafer producing process starting from the step S310 of introducing the gas.

The production method relating to the present embodiment includes the step S310 of placing the first semiconductor and introducing the gas and the step S320 of heating the first semiconductor. Accordingly, even if a newly placed first semiconductor 210 is polluted by a large amount of impurities such as Si atoms left over in the reaction chamber from a preceding producing process, C contained in CCl$_3$Br compensates for the donor effects of the residual Si atoms on the surface of the first semiconductor 210. This can suppress the affects of the impurity atoms such as Si atoms present on the surface of the first semiconductor 210. Since the affects of the impurity atoms can be suppressed, insulation failures can be prevented from occurring between the first semiconductor 210 and the semiconductors to be epitaxially grown thereon.

In addition, the present embodiment can further suppress leakage currents and prevent insulation failures by forming the carrier-trapping layer 232 having electron-trapping centers or hole-trapping centers in the step S332 of forming the carrier-trapping layer. In addition, the present embodiment can further suppress leakage currents and prevent insulation failures by forming the depleted semiconductor 234 including a plurality of p-type semiconductors that may form heterojunctions in the step S334 of forming the depleted semiconductor. As a result, the present embodiment can assure device separation between a HEMT formed using the second semiconductor 244 and other constituents and an HBT formed in the third semiconductor 260.

Since the semiconductor wafer 200 has the carrier-trapping layer 232, the step intended to reduce the affects of the first impurity atoms, i.e., Si atoms, left within the reaction chamber can be skipped after the step S360 of removing the completed semiconductor wafer 200. Thus, a subsequent first semiconductor 210 to be processed can be immediately placed within the reaction chamber to repeatedly perform the semiconductor wafer producing process starting from the step S310 of introducing the gas into the reaction chamber. As a result, the semiconductor layer for a HEMT and the semiconductor layer for an HBT can be formed in the same reaction chamber with it being possible to prevent the preceding process from affecting the following process. Thus, the produced semiconductor wafer 200 can be suitably used to monolithically produce the HEMT and the HBT thereon, and the production efficiency can be significantly improved.

Figure 5:
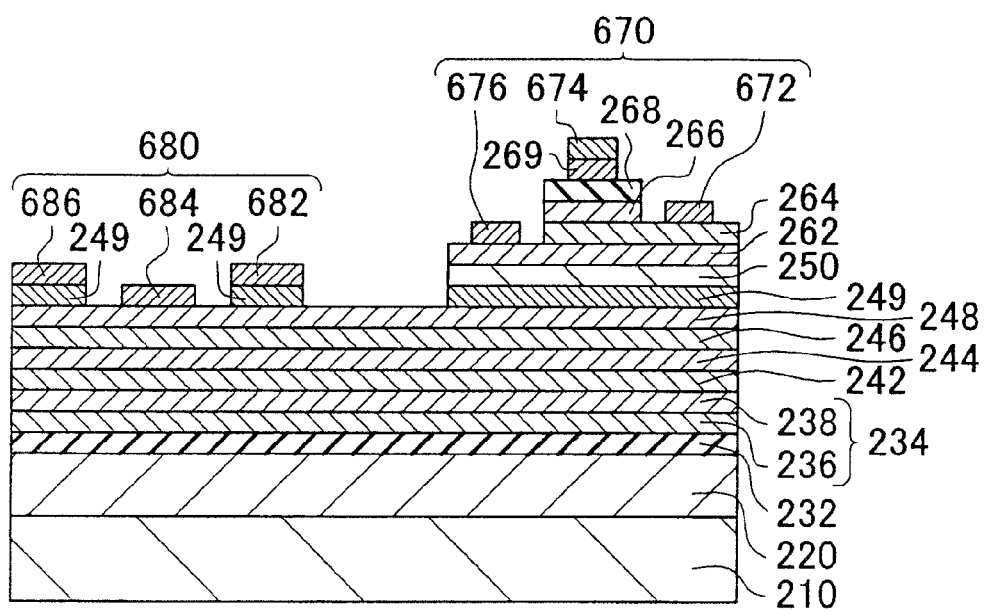
FIG. 5 illustrates an exemplary cross-section of an electronic device 600.

FIG. 5 schematically illustrates an exemplary cross-section of an electronic device 600. The electronic device 600 includes the first semiconductor 210, the buffer layer 220, the carrier-trapping layer 232, the depleted semiconductor 234, the carrier-supplying semiconductor 242, the second semiconductor 244, the carrier-supplying semiconductor 246, the barrier-forming semiconductor 248, the contact layer 249, the buffer layer 250, an HBT 670, and a HEMT 680. The electronic device 600 is an exemplary electronic device that includes the HBT 670 and the HEMT 680 and is formed using the semiconductor wafer 200. Therefore, the explanation of the common components between the electronic device 600 and the semiconductor wafer 200 is omitted.

The HBT 670 includes a base electrode 672, an emitter electrode 674, and a collector electrode 676. The emitter electrode 674 is formed on the emitter layer 266 with the contact layer 269 being positioned therebetween. The base electrode 672 is formed on the base layer 264. The collector electrode 676 is formed on the collector layer 262.

The HEMT 680 includes a drain electrode 682, a gate electrode 684, and a source electrode 686. The gate electrode 684 forms a Schottky contact with the carrier-supplying semiconductor 246 with the barrier-forming semiconductor 248 being positioned therebetween. The drain electrode 682 and the source electrode 686 form an ohmic contact with the contact layer 249.

In the present embodiment, the HBT 670 and the HEMT 680 are formed on the single semiconductor wafer 200. Since the semiconductor wafer 200 includes the carrier-trapping layer 232, highly reliable insulation is established between the first semiconductor 210 and the second semiconductor 244. Therefore, leakage currents can be prevented. Furthermore, the above-described method of producing the semiconductor wafer 200, in particular, the heating performed in the heating step S320 of the production method can reduce the adverse effects of the impurity atoms adhered to the surface of the first semiconductor 210. As a result, leakage currents can be prevented, and the HBT 670 and the HEMT 680 can be electrically separated from each other.

EXAMPLE EXPERIMENT 1

In Example Experiment 1, a semiconductor wafer was fabricated that includes all the semiconductor layers of the semiconductor wafer 200 shown in FIG. 2 except for the semiconductor layers from the contact layer 249 to the contact layer 269. A GaAs single-crystal wafer was used as the first semiconductor 210. An i-type GaAs was formed as the buffer layer 220 and oxygen-doped i-type AlGaAs was formed as the carrier-trapping layer 232.

As the depleted semiconductor 234, a lightly-doped p-type semiconductor layer was formed that has five sets of alternately stacked GaAs and AlGaAs while the molar supply ratio of the Group 5 source to the Group 3 source was regulated. As the carrier-supplying semiconductor 242 and the carrier-supplying semiconductor 246, n-type AlGaAs was formed. As the carrier movement layer 244, i-type InGaAs was formed. As the barrier-forming semiconductor 248, i-type AlGaAs was formed.

The respective semiconductor layers from the buffer semiconductor 220 to the barrier-forming semiconductor 248 were sequentially formed on the first semiconductor 210 using MOCVD. As the Group 3 element source, trimethylgallium (TMG, Ga(CH$_3$)$_3$), trimethylaluminum (TMA, Al(CH$_3$)$_3$), and trimethylindium (TMI, In(CH$_3$)$_3$) were used. As the Group 5 element source gas, arsine (AsH$_3$) and phosphine (PH$_3$) were used. As the n-type impurity element, disilane (Si$_2$H$_6$) was used. As the source of oxygen, di-n-buthyl ether (CH$_3$(CH$_2$)$_2$CH$_2$OCH$_2$(CH$_2$)$_2$CH$_3$) was used. The carrier-trapping layer 232 had a thickness of 300 nm, the carrier-trapping layer 232 had an oxygen concentration of $1 \times 10^{19}$ cm$^{-3}$, and the depleted semiconductor 234 had a thickness of 400 nm.

EXAMPLE EXPERIMENT 2

In Example Experiment 2, a semiconductor wafer was fabricated that is the same as the semiconductor wafer of Example Experiment 1 except for that the semiconductor layer corresponding to the depleted semiconductor 234 was a low-concentration impurity layer with n carrier type. In Example Experiment 2, since the semiconductor layer corresponding to the depleted semiconductor 234 is a low-concentration n-type layer, the fabricated semiconductor wafer had no depleted region.

The withstand voltages of the semiconductor wafers fabricated in Example Experiment 1 and Example Experiment 2 were measured and respectively 34 V for Example Experiment 1 and 7 V for Example Experiment 2. This result proves that Example Experiment 1 achieves improved withstand voltage since the depleted semiconductor 234 forms a depleted region. Here, the withstand voltage is defined as a voltage that yields a current density of 5 mA/cm$^2$ between the first semiconductor 210 and the carrier-supplying semiconductor 242.

EXAMPLE EXPERIMENT 3

A semiconductor wafer was fabricated that is the same as the semiconductor wafer of Example Experiment 1 except for that the thickness of the carrier-trapping layer 232 was varied among 20 nm, 100 nm, and 150 nm, the oxygen concentration of the carrier-trapping layer 232 was set at $7\times10^{19}$ cm$^{-3}$, and the thickness of the depleted semiconductor 234 was set at 300 nm. The withstand voltage of the fabricated semiconductor wafer is shown in FIG. 6 as a function of the thickness of the carrier-trapping layer 232. FIG. 6 reveals that the withstand voltage increases as the thickness of the carrier-trapping layer 232 increases. In particular, the withstand voltage was remarkably improved when the carrier-trapping layer 232 had a thickness of 100 nm or more.

EXAMPLE EXPERIMENT 4

The semiconductor wafer 200 shown in FIG. 2 was fabricated. As the first semiconductor 210, a GaAs single-crystal wafer was used. As the buffer layer 220, i-type GaAs was formed. As the carrier-trapping layer 232, oxygen-doped i-type AlGaAs was formed. As the depleted semiconductor 234, a lightly-doped p-type semiconductor layer was formed that has five sets of alternately stacked GaAs and AlGaAs while the molar supply ratio of the Group 5 source to the Group 3 source was regulated. As the carrier-supplying semiconductor 242 and the carrier-supplying semiconductor 246, n-type AlGaAs was formed. As the carrier movement layer 244, i-type InGaAs was formed. As the barrier-forming semiconductor 248, i-type AlGaAs was formed.

As the contact layer 249, highly-doped n-type GaAs was formed. As the buffer layer 250, n-type InGaP was formed. As the collector layer 262, n-type GaAs was formed. As the base layer 264, highly-doped p-type GaAs was formed. As the emitter layer 266, n-type InGaP was formed. As the ballast resistance layer 268, n-type GaAs was formed. As the contact layer 269, highly-doped n-type InGaAs was formed.

The respective semiconductor layers from the buffer layer 220 to the contact layer 269 were sequentially formed on the first semiconductor 210 using MOCVD. As the Group 3 element source, TMG, TMA and TMI were used. As the Group 5 element source gas, arsine and phosphine were used. As the n-type impurity element, disilane was used. As the p-type impurity element source, BrCCl$_3$ was used. As the source for oxygen, di-n-buthyl ether was used.

Four semiconductor wafers were fabricated in which the thickness of the carrier-trapping layer 232 was 100 nm, the thickness of the depleted semiconductor 234 was 440 nm, and the oxygen concentration of the carrier-trapping layer 232 was varied among $0.6\times10^{19}$ cm$^{-3}$, $1.8\times10^{19}$ cm$^{-3}$, $2.4\times10^{19}$ cm$^{-3}$ and $7.9\times10^{19}$ cm$^{-3}$. The withstand voltages of these semiconductor wafers are shown in FIG. 7 as a function of the oxygen concentration of the carrier-trapping layer 232. FIG. 7 shows that the withstand voltage increases as the oxygen concentration increases. The withstand voltage is substantially in proportion to the oxygen concentration.

EXAMPLE EXPERIMENT 5

Figure 8:
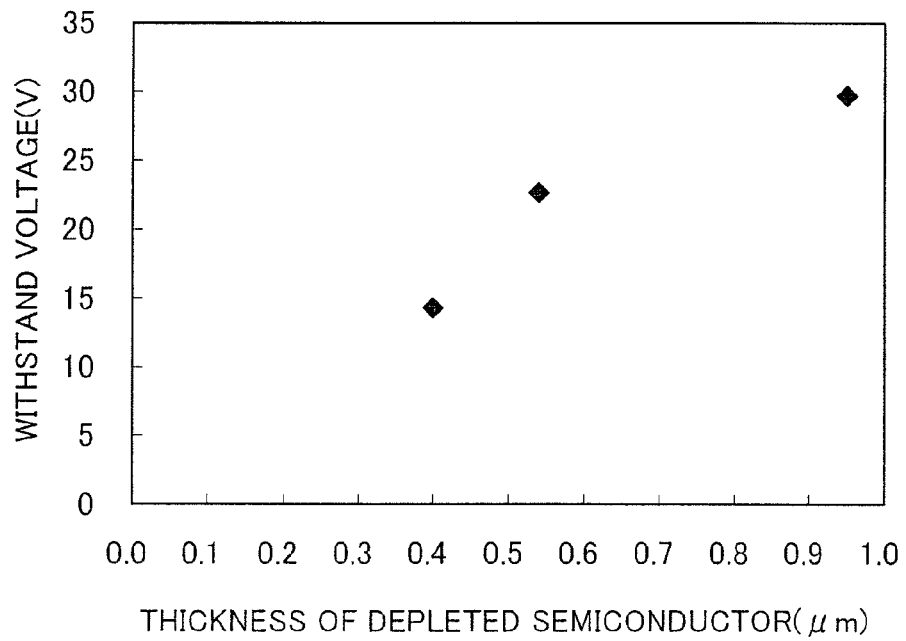
FIG. 8 illustrates the withstand voltage of a semiconductor wafer as a function of the thickness of a depleted semiconductor 234.

Three semiconductor wafers were fabricated in which the thickness of the carrier-trapping layer 232 was 100 nm, the oxygen concentration of the carrier-trapping layer 232 was $3\times10^{19}$ cm$^{-3}$, and the thickness of the depleted semiconductor 234 was varied among 950 nm, 400 nm, and 540 nm. Except for these, the three semiconductor wafers had the same configuration as the semiconductor wafers of Example Experiment 4. The withstand voltages of these semiconductor wafers are shown in FIG. 8 as a function of the thickness of the depleted semiconductor 234. FIG. 8 shows that the withstand voltage increases as the thickness of the depleted semiconductor 234 increases.

Figure 9:
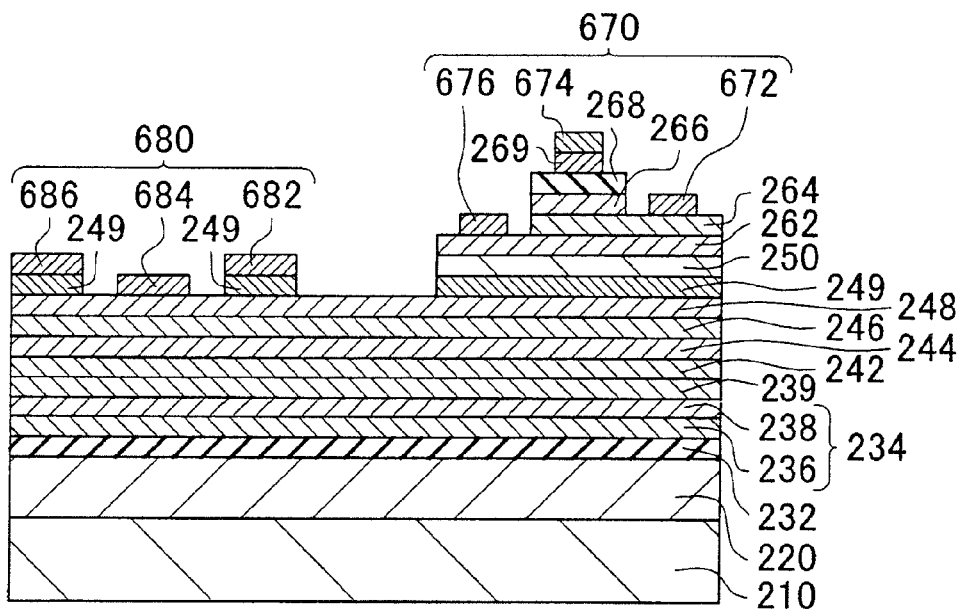
FIG. 9 illustrates another exemplary cross-section of a semiconductor device.

In the above-described embodiments, any semiconductor layers can be added without departing from the principle of the invention. As shown in FIG. 9, for example, a depleted region 239 can be formed between the depleted semiconductor 238 and the second semiconductor 244. This can further increases the insulation characteristics of semiconductor wafers.

Figure 10:
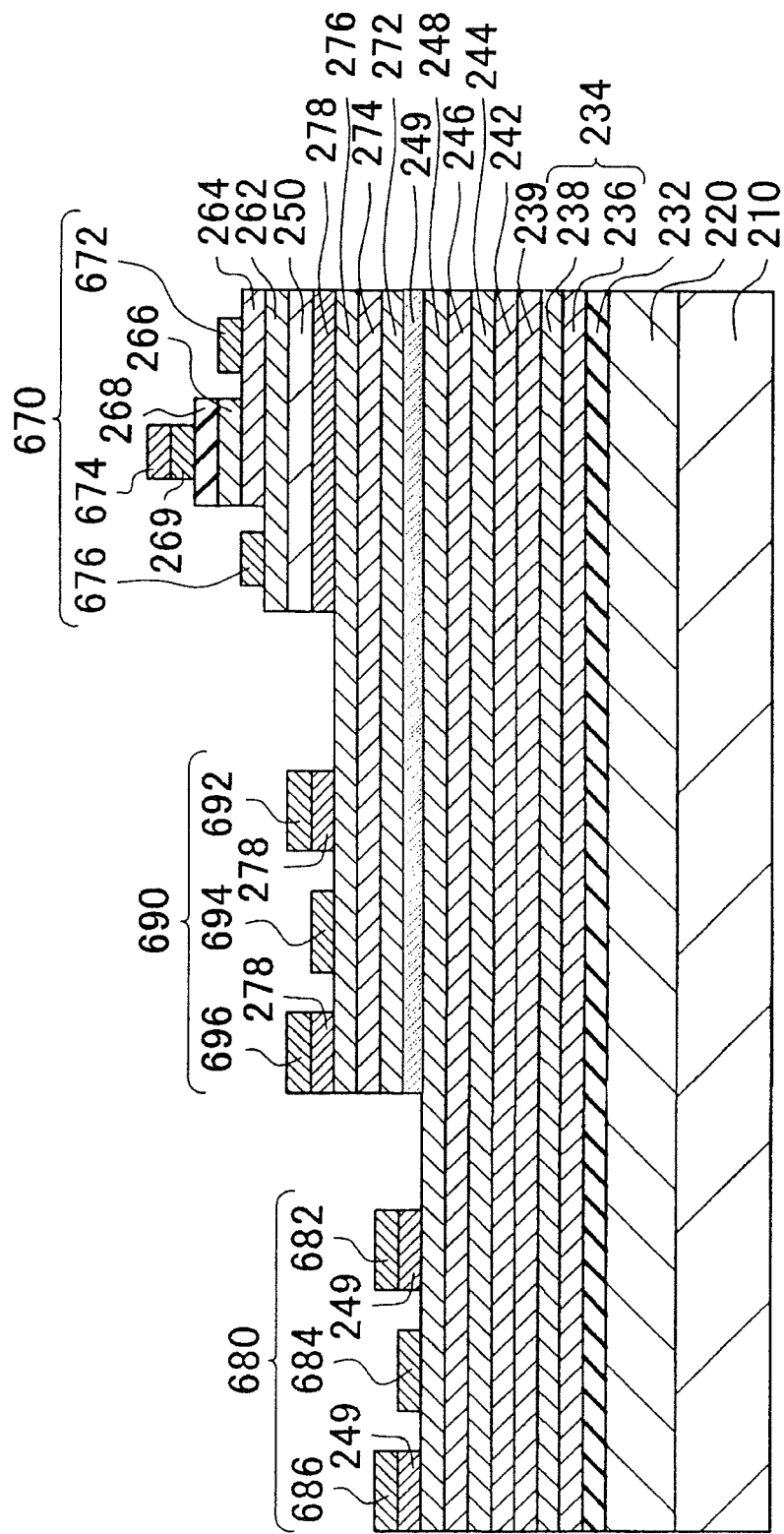
FIG. 10 illustrates yet another exemplary cross-section of a semiconductor device.

Furthermore, as shown in FIG. 10, a buffer layer 272, a carrier movement layer 274, a barrier-forming semiconductor 276 and a contact layer 278 can be formed between the semiconductor layer used for forming the HEMT 680 and the semiconductor layer used for forming the HBT 670. In the buffer layer 272, the carrier movement layer 274, the barrier-forming semiconductor 276, and the contact layer 278, a second HEMT 690 can be formed. Specifically speaking, the second HEMT 690 can be formed by forming a gate electrode 694 on the barrier-forming semiconductor 276 and forming a drain electrode 692 and a source electrode 696 on the barrier-forming semiconductor 276 with the contact layer 278 positioned therebetween. The HEMT 680 and the second HEMT 690 can form a complementary FET. Thus, the present semiconductor wafer can be used to fabricate a BiFET semiconductor including a complementary FET and an HBT. Here, the HEMT 680 and the second HEMT 690 do not need to be HEMTs and may be instead general FETs.

What is claimed is:

1. A semiconductor wafer comprising:
   a first semiconductor that contains a Group 3-5 compound semiconductor;
   a carrier-trapping layer that is formed directly or indirectly on the first semiconductor and has an electron-trapping center or a hole-trapping center, wherein the carrier-trapping layer contains a boron atom or an oxygen atom;
   a second semiconductor that is epitaxially grown directly or indirectly on the carrier-trapping layer and serves as a channel in which free electrons or free holes move;
   a third semiconductor including a stack represented by n-type semiconductor/p-type semiconductor/n-type semiconductor or represented by p-type semiconductor/n-type semiconductor/p-type semiconductor, the stack epitaxially grown directly or indirectly on the second semiconductor; and
   a p-type semiconductor layer that is disposed between the carrier-trapping layer and the second semiconductor and adjacent to an n-type semiconductor such that a depleted region is formed in a vicinity of a junction between the p-type semiconductor layer and the n-type semiconductor, wherein
   the p-type semiconductor layer includes a p-type Al$_x$Ga$_{1-x}$As ($0 \leq x \leq 1$) and a p-type Al$_y$Ga$_{1-y}$As ($0 \leq y \leq 1$, $x \leq y$), and
   the p-type Al$_x$Ga$_{1-x}$As ($0 \leq x \leq 1$) and the p-type Al$_y$Ga$_{1-y}$As ($0 \leq y \leq 1$, $x \leq y$) form a heterojunction.

2. The semiconductor wafer as set forth in claim 1, wherein the p-type semiconductor layer is not less than 0.3 μm and not more than 1.5 μm in thickness in the growth direction between the first semiconductor and the second semiconductor.

3. The semiconductor wafer as set forth in claim 1, wherein the p-type semiconductor layer further comprises at least two adjoining Group 3-5 compound semiconductors selected from the group consisting of a p-type Al$_p$In$_q$Ga$_{1-p-q}$P ($0 \leq p \leq 1$, $0 \leq q \leq 1$), a p-type Al$_r$In$_s$Ga$_{1-r-s}$P ($0 \leq r \leq 1$, $0 \leq s \leq 1$, $p \leq r$), a p-type Al$_x$Ga$_{1-x}$As ($0 \leq x \leq 1$) and a p-type Al$_p$In$_q$Ga$_{1-p-q}$P ($0 \leq p \leq 1$, $0 \leq q \leq 1$), wherein the at least two adjoining Group 3-5 compound semiconductors together form at least one heterojunction selected from the group consisting of a heterojunction between p-type Al$_p$In$_q$Ga$_{1-p-q}$P ($0 \leq p \leq 1$, $0 \leq q \leq 1$) and p-type Al$_r$In$_s$Ga$_{1-r-s}$P ($0 \leq r \leq 1$, $0 \leq s \leq 1$, $p \leq r$), and a heterojunction between p-type Al$_x$Ga$_{1-x}$As ($0 \leq x \leq 1$) and p-type Al$_p$In$_q$Ga$_{1-p-q}$P ($0 \leq p \leq 1$, $0 \leq q \leq 1$).

4. The semiconductor wafer as set forth in claim 1, wherein the carrier-trapping layer contains an oxygen atom and one of $Al_xGa_{1-x}As$ (0≤x≤1) and $Al_pIn_qGa_{1-p-q}P$ (0≤p≤1, 0≤q≤1).

5. The semiconductor wafer as set forth in claim 1, wherein the concentration of the oxygen atom is not less than $1\times10^{18}$ cm$^{-3}$ and not more than $1\times10^{20}$ cm$^{-3}$.

6. The semiconductor wafer as set forth in claim 1, wherein at least one semiconductor of the second semiconductor and the third semiconductor contains carbon.

7. The semiconductor wafer as set forth in claim 1, wherein at least one semiconductor of the second semiconductor and the third semiconductor contains silicon.

8. The semiconductor wafer as set forth in claim 1, wherein the third semiconductor contains silicon with which the third semiconductor is doped in a concentration of not less than $1\times10^{18}$ cm$^{-3}$.

9. The semiconductor wafer as set forth in claim 1, wherein the third semiconductor includes a ballast resistance layer having a resistance that suppresses a current flowing through the n-type semiconductor/p-type semiconductor/n-type semiconductor or the p-type semiconductor/n-type semiconductor/p-type semiconductor.

10. The semiconductor wafer as set forth in claim 1, further comprising
a fourth semiconductor that is disposed between the second semiconductor and the third semiconductor and has a carrier of a conductivity type opposite to the conductivity type of the carrier in the second semiconductor.

11. The semiconductor wafer as set forth in claim 1, wherein
the carrier-trapping layer is not less than 0.1 μm and not more than 1.5 μm in thickness in the growth direction between the first semiconductor and the second semiconductor.

12. An electronic device comprising:
a first semiconductor that contains a Group 3-5 compound semiconductor;
a carrier-trapping layer formed directly or indirectly on the first semiconductor, wherein the carrier-trapping layer contains a boron atom or an oxygen atom;
a second semiconductor that is epitaxially grown directly or indirectly on the carrier-trapping layer and serves as a channel in which free electrons or free holes move;
a third semiconductor including a stack represented by n-type semiconductor/p-type semiconductor/n-type semiconductor or represented by p-type semiconductor/n-type semiconductor/p-type semiconductor, the stack epitaxially grown directly or indirectly on the second semiconductor;
a field-effect transistor formed in the second semiconductor;
a heterojunction bipolar transistor formed in the third semiconductor; and
a p-type semiconductor layer that is disposed between the carrier-trapping layer and the second semiconductor and adjacent to an n-type semiconductor such that a depleted region is formed in a vicinity of a junction between the p-type semiconductor layer and the n-type semiconductor, wherein
the p-type semiconductor layer includes a p-type $Al_xGa_{1-x}As$ (0≤x≤1) and a p-type $Al_yGa_{1-y}As$ (0≤y≤1, x≤y), and
the p-type $Al_xGa_{1-x}As$ (0≤x≤1) and the p-type $Al_yGa_{1-y}As$ (0≤y≤1, x≤y) form a heterojunction.

* * * * *